United States Patent [19]

Smith et al.

[11] 4,377,747
[45] Mar. 22, 1983

[54] NON-UNIFORM THERMAL IMAGING DETECTOR

[75] Inventors: Bernard T. Smith, El Toro; Wayne T. Armstrong, Mission Viejo; Richard D. Nelson, Santa Ana, all of Calif.

[73] Assignee: Ford Aerospace and Communication Corporation, Detroit, Mich.

[21] Appl. No.: 214,310

[22] Filed: Dec. 8, 1980

[51] Int. Cl.³ .......................... G01T 1/22; H01J 31/49
[52] U.S. Cl. ..................................... 250/370; 250/334
[58] Field of Search ............... 250/330, 334, 338, 370, 250/371; 357/29, 30, 28; 358/113

[56] References Cited

U.S. PATENT DOCUMENTS

| 3,621,256 | 11/1971 | Cacheux et al. | 250/370 |
| 3,723,642 | 3/1973 | Laakmann | 178/6 |
| 3,889,117 | 6/1975 | Shaw | 250/332 |
| 3,934,143 | 1/1976 | Prag | 250/370 |
| 3,995,159 | 11/1976 | Elliott | 250/370 |
| 4,017,732 | 4/1977 | Runciman | 250/334 |
| 4,054,797 | 10/1977 | Milton et al. | 250/332 |
| 4,103,160 | 7/1978 | Moss | 250/334 |
| 4,106,046 | 8/1978 | Nathanson | 357/30 |
| 4,142,206 | 2/1979 | Ennulat | 358/113 |
| 4,176,275 | 11/1979 | Korn et al. | 250/213 |
| 4,190,851 | 2/1980 | Finnila et al. | 357/30 |
| 4,198,646 | 4/1980 | Alexander et al. | 357/30 |
| 4,210,805 | 7/1980 | Kobayashi et al. | 250/370 |

OTHER PUBLICATIONS

"Theoretical and Experimental Investigation of a Charge Transport Detector", Jul. 15, 1980 by Bleicher et al.

Primary Examiner—Alfred E. Smith
Assistant Examiner—Janice A. Howell
Attorney, Agent, or Firm—Paul K. Godwin, Jr.; Clifford L. Sadler

[57] ABSTRACT

A radiation sensitive detector employed with a thermal radiation scanning system to receive images that are scanned across said detector at predetermined velocities. The detector is sensitive to these scanned images and generates minority photocarriers that drift along the length of the detector in the opposite direction as a majority carrier flow caused by an applied biasing field. The cross-section of the detector is non-uniform along its length direction so that the density and velocity of the photocarrier packets may be appropriately controlled over the length of the detector.

8 Claims, 1 Drawing Figure

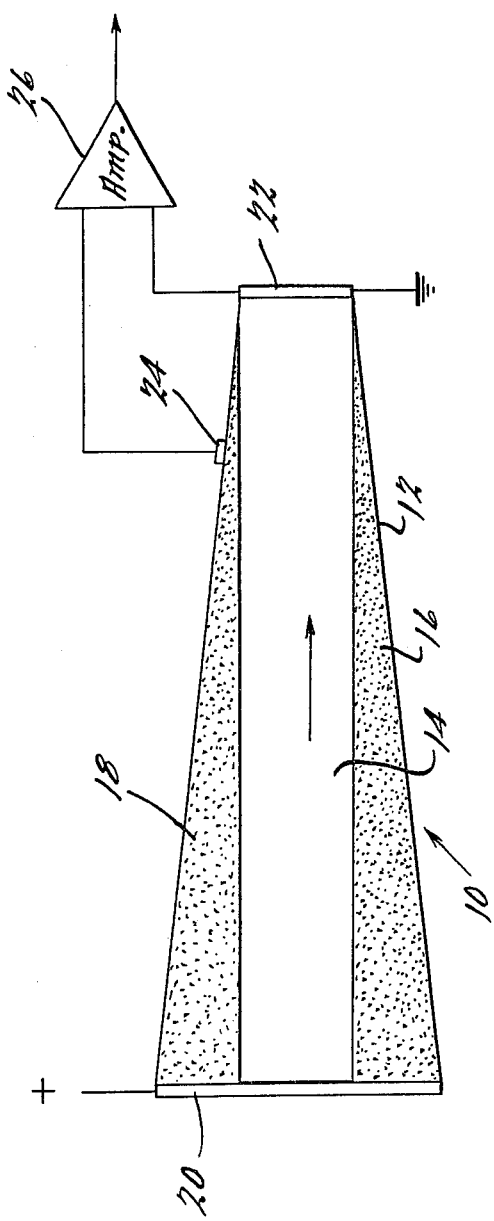

NON-UNIFORM THERMAL IMAGING DETECTOR

BACKGROUND OF THE INVENTION

1. Field of the Invention

The present invention is directed to the field of thermal image detection and more specifically to detectors which provide internal integration of a received image.

2. Description of the Prior Art

The background prior art, with respect to the present invention, is adequately described in U.S. Pat. No. 3,995,159, which is incorporated herein by reference. The thermal imaging detector device described in the above referenced patent, includes a uniform linear elongated strip of semiconductor material, which is rendered photoconductive by the generation of electron and hole photocarriers when a radiation image is scanned along the strip. It further includes means for applying a lengthwise electric bias current through the strip for the purpose of producing an ambipolar drift of the photocarriers in the strip having a drift velocity that matches the image scanning velocity.

The described strip is a rectangularly shaped ribbon which has one surface totally exposed to receive the scanned radiation over its length. The image is scanned along the strip at a velocity which is said to match that of the ambipolar drift so that an integrated picture can be built up from all the active parts (accumulated charge packets) that traverse a readout electrode.

We have found that as a packet of charge moves along the exposed surface of the uniform integrating detector strip it tends to bloom during the integration period of the scan which degrades the resolution of the image.

We have also found that the uniform integrating detector strip has a tendency to lose some of the accumulated carriers at the width edges, due to surface recombination. This loss of accumulated carriers reduces the amplitude of the signal readout from the detector.

In the type of detector wherein integration is achieved on the detector itself, the individual pixels of image are scanned across the detector and a corresponding packet of photogenerated minority carriers are generated to flow along the length of the detector at a velocity determined by the bias field. It is important that each packet of charge flows at the same velocity as the scanned image so that when each packet arrives at the readout electrode, it will have a charge density concentration that corresponds to the focused pixel intensity of the image integrated over the period of the scan.

If the velocities are not synchronous, the resultant signal will have a lower amplitude and adjacent signals are less distinctive with a resultant lower resolution.

The above-referenced patent suggests that small variations in the image scanned velocity may be compensated for by adjusting the bias current. That solution may be appropriate where a single pixel is focused onto the detector and a single packet of photocarriers is generated to track that scanned pixel. In that case, any variation between the velocities of the packet and the pixel may be compensated for by appropriately varying the bias current and thereby causing the single packet to increase or decrease its drift velocity in order to track with the scanned pixel.

When a series of pixels are scanned along the detector and are simultaneously present on the detector, a plurality of adjacent photocarrier packets are correspondingly generated on the detector during each scan. Therefore, if one were to vary the bias current to compensate for variations between the scanned velocity of any pixel and packet, such variation in the current will have a simultaneous effect on all the photocarrier packets present on the detector.

We have noted that the drift velocity "V" of any charge packet is directly dependent upon the electric bias field density "E" and a mobility factor "U" (i.e., $V = Eu$). As long as each factor is constant, the drift velocity V will remain constant. However, the mobility factor u is inversely related to the charge buildup and, for a constant E, causes the drift velocity of each charge packet to decrease as that packet traverses the length of the detector.

Due to the fact that the charge buildup in each packet is primarily due to the background radiation, the charge buildup due to the focused image feature is of minor consideration in viewing the change in drift velocity as each packet travels the length of the detector.

SUMMARY OF THE INVENTION

It is an object of the present invention to reduce the loss of carriers in a thermal image detector due to edge occurring recombination.

It is another object of the present invention to increase the charge density concentration of each charge packet for an increase in signal voltage and resolution.

It is a further object of the present invention to compensate for the charge buildup that inherently affects the drift velocity by providing a detector strip that is configured so as to have a varying electric field density over the length of the strip.

The cross-sectional configuration of the present invention is selected to dictate the bias field density at each point along the exposed length of the detector, which in turn influences the speed of the minority carrier packets as they flow past these points.

The problems of the prior art are thus overcome by the present invention, which provides a thermal image detector having a non-uniform cross-section over its length of exposure to a scanned image.

In the preferred embodiment of the invention, one surface of the detector is separated into exposed and unexposed portions. The exposed surface of the detector has a constant width along the detector length and is oriented to receive an image scanned along its length. Unexposed surface portions of the detector lie to either side of the exposed surface portion along its length and are masked from receiving radiation. The detector has an overall truncated shape of a constantly changing width along the length dimension. A biasing current is generated, which flows along the length of the detector, and the density of the biasing current field increases as the cross-section of the detector decreases. Accordingly, the photoconductor charge packets that travel along the length of the exposed portion of the detector are continually influenced by the ever increasing bias field density. The converging field is sufficient to concentrate the ever accumulating charge packet within a defined area, reduce carrier losses by concentrating the charge density away from the edges of the detector strip and maintain the drift velocity at a constant, as its mobility factor decreases.

BRIEF DESCRIPTION OF THE DRAWING

The FIGURE illustrates a working surface view of the preferred embodiment of the invention.

DETAILED DESCRIPTION OF THE PREFERRED EMBODIMENT

The thermal radiation image detector 10 of the present invention comprises an elongated strip 12 of uniformly doped semiconductor material having a generally uniform thickness. Biasing electrodes 20 and 22 are attached to opposing ends of the strip 12 so as to provide equipotentials across each of those ends. The biasing electrode 20 is connected to a positive potential source (not shown); and the biasing electrode 22 is connected to ground. The application of the D.C. potential across the electrodes 20 and 22 causes a biasing current of majority carriers (i.e., electrons in an n type material) to flow along the length of the strip 12.

The upper surface of the strip 12 is shown in the FIGURE and has a generally converging shape when viewed from left to right. The left end of the strip 12 at which the electrode 20 is attached, is of a larger width than the right end at which the electrode 22 is attached. Between the ends, the width of the strip 12 is non-uniform so as to provide a non-uniform cross-section to the bias field. Accordingly, the biasing field has a convergent factor over the length of the strip 10 which provides for an ever increasing field density over that length.

The upper surface has defined exposed and unexposed portions. The exposed portion 14 is rectangular along the length of the strip 12 and its width corresponds to the height of the portion of the focused image (pixel height) that is to be directed onto that portion of the detector. The length of the exposed portion 14 extends from end to end of the strip 12. The exposed portion 14 is so designated because it is preferably located so as to receive a focused thermal image that is longitudinally scanned thereacross.

The unexposed portions 16 and 18 of the upper surface of the strip 12 are masked so as to prevent extraneous radiation from reaching those portions of the detector. The unexposed masked portions 16 and 18 lie to either side of the exposed portion 14 and are approximately triangularly shaped to conform to the shape of the strip 12.

At least one readout electrode 24 is disposed adjacent the grounded electrode 22 and is used along with the electrode 22 and an amplifier 26 to detect passage of individual charge packets of photogenerated minority carriers. The electrode 24 is shown as a single element connected to the side of the strip so as to not interfere with the passage of charge carriers. However, the readout electrode 24 may be embodied as several electrically conductive strips spaced along a defined length of the detector or formed as a non-ohmic electrode semiconductor region in a conventional manner.

In operation, the biasing current is generated and the electric field along the length of the strip 12 is of a non-uniform density.

As an image is scanned along the exposed surface portion 14, in the direction indicated by the arrow, photocarriers are generated in distinct charge packets and are comprised of minority carriers which are subjected to ambipolar drift in a direction opposite to that of the majority carrier conduction.

The drift velocity of the packets over the length of the scan is maintained precisely constant due to the converging biased field having a counter effect to that of the decreasing mobility factor that results from the ever increasing number of photocarriers produced over the length of the scan.

The converging biased field also provides a confinement influence onto the charge packets as they drift along the exposed surface which in turn results in a higher signal-to-noise ratio output from the detector and affords a higher resolution of each pixel of the scanned image.

The confinement of the charge packets, combined with the separation of the exposed portion of the surface from the edges of the detector decreases the amount of recombination carrier losses and further results in an improved signal amplitude at the readout electrodes.

It will be apparent that many modifications and variations may be implemented without departing from the scope of the novel concept of this invention. Therefore, it is intended by the appended claims to cover all such modifications and variations which fall within the true spirit and scope of the invention.

We claim:

1. In a thermal radiation image scanning system which employs means for scanning a thermal radiation image across a focal plane, an integrating detector for receiving said scanned radiation on an exposed surface thereof, wherein said integrating detector is an elongated strip of semiconductor material rendered photoconductive by the generation of electron and hole photocarriers when said radiation image is scanned along said strip, first and second biasing electrodes mounted on opposite ends of said strip and means for applying a D.C. biasing source to said first and second electrodes to produce a generally lengthwise D.C. electric current flow through said strip and thereby cause an ambipolar drift of photocarriers in said strip and at least one read out electrode on said strip located near the end of said strip to which said photocarriers are drifting, an improvement whereby said elongated detector strip is formed to have a constantly variable cross-section along its length of elongation thereby affecting the charge density of said drifting photocarriers along the length of said detector strip by the resultant variations in the electrical bias field density along said length.

2. An improved detector strip as in claim 1, wherein said exposed surface of said strip is a portion of a larger strip surface and is of a constant width dimension along said direction of said photocarrier drift and the remainder of said strip surface is masked from exposure to said scanned radiation.

3. An improved detector strip as in claim 1, wherein said strip has a generally constant thickness and a constantly decreasing width in the direction of said photocarrier drift.

4. An improved detector strip as in claim 3, wherein said exposed surface of said strip is a portion of a larger strip surface and is of a constant width dimension along said direction of said photocarrier drift and the remainder of said strip surface is masked from exposure to said scanned radiation.

5. In association with a thermal image scanning system, a non-uniform integrating detector comprising:
   a generally elongated strip of semiconductor material having a continuously variable cross-section over its length dimension and having an elongated first surface portion exposed along said length dimension to receive thermal images from said associated thermal image scanning system and generate minority photocarriers therein;

first and second biasing electrodes mounted at opposite ends of said strip for connection to an external D.C. potential source to produce a biasing electric current along the length dimension of said strip and cause a directional drift of said minority photocarriers; and a first readout electrode on said strip adjacent one of said biasing electrodes.

6. A non-uniform integrating detector as in claim 5, wherein said exposed surface of said strip is a portion of a larger strip surface and is of a constant width dimension along said direction of said photocarrier drift and the remainder of said strip surface is masked from said exposure to said thermal images.

7. A non-uniform integrating detector as in claim 5, wherein said strip has a generally constant thickness and a constantly decreasing width in the direction of said biasing current.

8. A non-uniform integrating detector as in claim 7, wherein said exposed surface of said strip is a portion of a larger strip surface and is of a constant width dimension along said direction of said photocarrier drift and the remainder of that surface is masked from said exposure to said thermal images.

* * * * *